(12) United States Patent
Gruber

(10) Patent No.: US 8,446,208 B2
(45) Date of Patent: May 21, 2013

(54) CIRCUIT ARRANGEMENT WITH TEMPERATURE COMPENSATION

(75) Inventor: Paul Gruber, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 14 days.

(21) Appl. No.: 13/071,005

(22) Filed: Mar. 24, 2011

(65) Prior Publication Data

US 2011/0234301 A1 Sep. 29, 2011

Related U.S. Application Data

(60) Provisional application No. 61/325,077, filed on Apr. 16, 2010.

(30) Foreign Application Priority Data

Mar. 24, 2010 (DE) .......................... 10 2010 012 688

(51) Int. Cl.
| | |
|---|---|
| *H01L 35/00* | (2006.01) |
| *H01L 37/00* | (2006.01) |
| *H03K 3/42* | (2006.01) |
| *H03K 17/78* | (2006.01) |

(52) U.S. Cl.
USPC ......................................................... 327/512

(58) Field of Classification Search
USPC ......................................................... 327/512
See application file for complete search history.

(56) References Cited

U.S. PATENT DOCUMENTS

| | | | | |
|---|---|---|---|---|
| 8,044,718 | B2 * | 10/2011 | Nicollini et al. ................. | 330/86 |
| 2003/0006822 | A1 * | 1/2003 | Murakami et al. ............ | 327/513 |
| 2007/0132507 | A1 * | 6/2007 | Gatta et al. ..................... | 327/552 |
| 2009/0201067 | A1 * | 8/2009 | Haneda .......................... | 327/306 |
| 2011/0229782 | A1 * | 9/2011 | Yamamoto ..................... | 429/429 |
| 2011/0234301 | A1 * | 9/2011 | Gruber ........................... | 327/513 |

FOREIGN PATENT DOCUMENTS

JP 58-202624 11/1983

* cited by examiner

*Primary Examiner* — Adam Houston
(74) *Attorney, Agent, or Firm* — Muncy, Geissler, Olds & Lowe, PLLC

(57) ABSTRACT

A circuit arrangement having at least one analog switch, which is operated by a supply voltage and which comprises a switching signal contact and a pair of switch contacts, whereby applied to the switching signal contact is an electrical switching signal depending on which an electrical connection can be switched between the switch contacts whose internal on-resistance is temperature dependent, whereby the circuit arrangement has in the vicinity of the at least one analog switch at least one additional similar reference analog switch, which is operated with the same common supply voltage and which is controlled such that the switch contacts thereof are/can be connected continuously via the internal temperature-dependent on-resistance thereof, whereby at least one comparison circuit is provided by means of which depending on the comparison of the internal on-resistance of the at least one reference analog switch with at least one external reference resistance or an otherwise setpoint setting of the reference analog switch(es), at least one control signal can be/is generated, by means of which the internal on-resistance of the at least one reference analog switch can be kept constant by changing the common supply voltage of all analog switches depending on the control signal, particularly can be adjusted to the at least one reference resistance, or the otherwise formed setpoint setting of the reference analog switch(es).

20 Claims, 2 Drawing Sheets

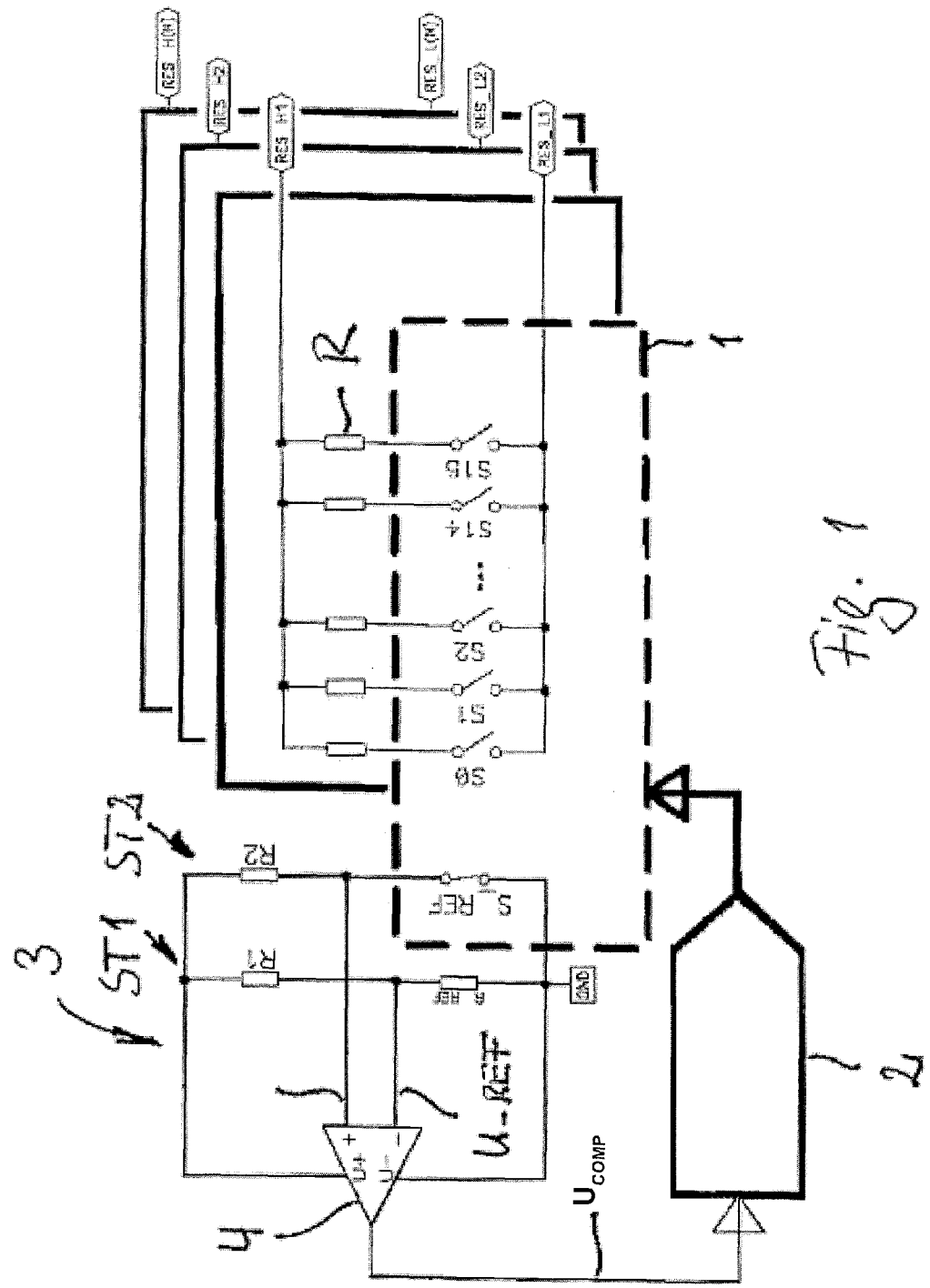

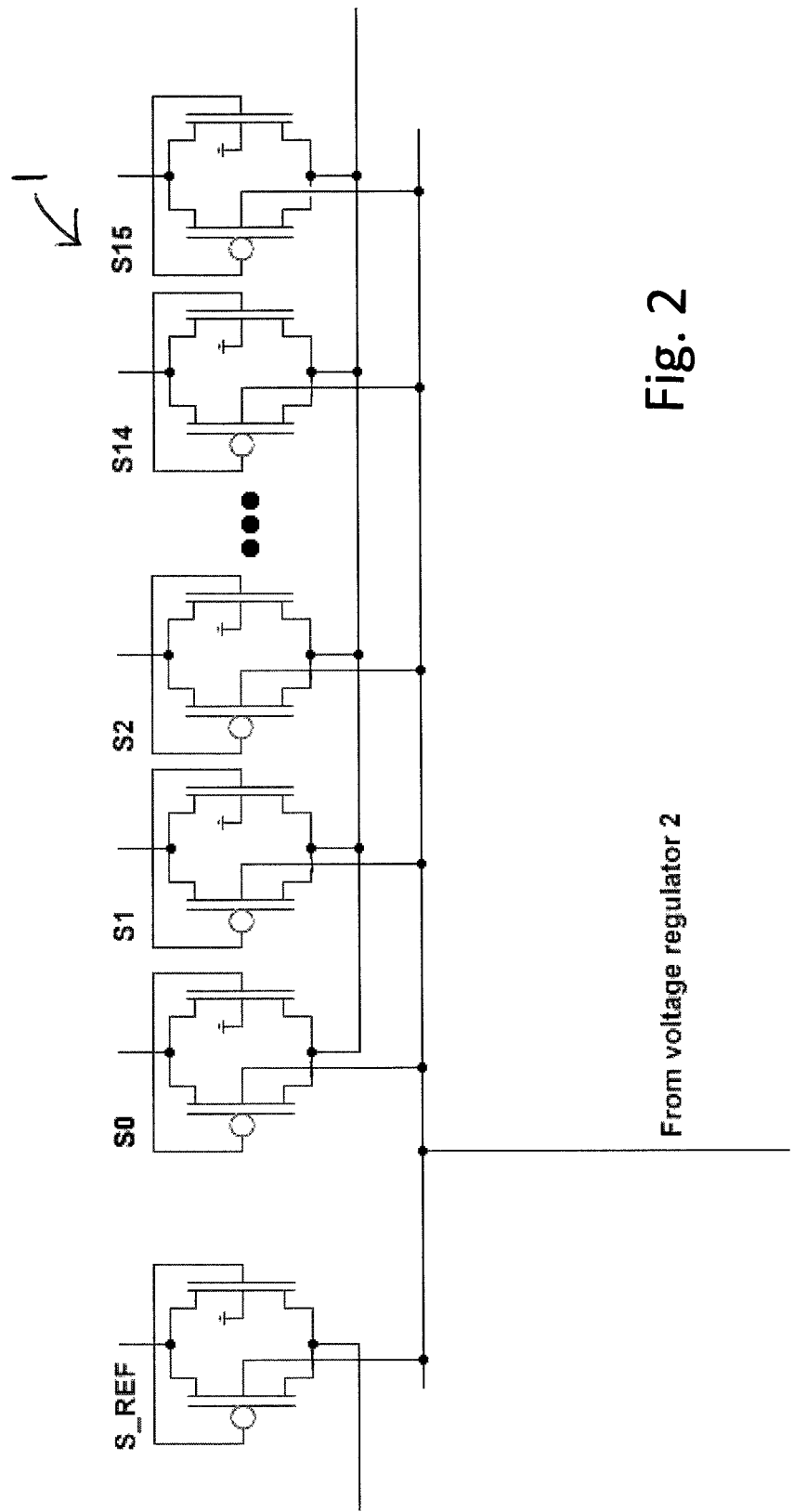

CIRCUIT ARRANGEMENT WITH TEMPERATURE COMPENSATION

This nonprovisional application claims priority to German Patent Application No. DE 10 2010 012 688.8, which was filed in Germany on Mar. 24, 2010, and to U.S. Provisional Application No. 61/325,077, which was filed on Apr. 16, 2010, and which are both herein incorporated by reference.

BACKGROUND OF THE INVENTION

1. Field of the Invention

The invention relates to a circuit arrangement having at least one analog switch which is operated with a supply voltage and comprises a switching signal contact and a pair of switch contacts, whereby applied to the switching signal contact is an electrical switching signal in dependence on which an electrical connection can be switched between the switch contacts whose internal on-resistance is temperature dependent.

The invention also relates to a method for compensating the temperature dependence of the on-resistance of at least one analog switch operated with a supply voltage.

2. Description of the Background Art

Analog switches are known in the conventional art and have the problem that their internal on-resistance, by which the switch contacts can be connected, has a temperature dependence. This is problematic especially in applications in which such analog switches are used to turn certain resistors on or off at a predefined resistance value in other electrical/electronic circuits, because in this case the internal on-resistance of the effectively operating resistance value generated together with the switched resistor is influenced depending on the temperature and thereby corrupted.

Typical applications of this type arise in a prototype test of vehicle control devices to which external resistance values are to be connected to simulate environmental conditions.

It is known further in the conventional art to carry out a temperature compensation, e.g., in that the ambient temperature of such an operated analog switch is kept as constant as possible, e.g., by devices for temperature control. Such devices, however, are complex, cost-intensive, consume power, and are slow.

SUMMARY OF THE INVENTION

It is therefore an object of the invention to provide a circuit arrangement and a method for temperature compensation by means of which operation of such analog switches can be achieved in a simple manner while their internal on-resistance is kept constant.

According to an aspect of the invention, this object is achieved by a circuit arrangement, which has in the vicinity of the at least one analog switch at least one additional similar reference analog switch, which is operated with the same common supply voltage and which is controlled such that the switch contacts thereof are connected continuously via the internal temperature-dependent on-resistance thereof, whereby at least one comparison circuit is provided by means of which depending on the comparison of the internal on-resistance of the at least one reference analog switch with the setpoint value of the same or another setpoint setting R_SET of the reference analog switch(es) S_REF, at least one control signal can be/is generated, by means of which the internal on-resistance of the at least one reference analog switch can be kept constant by changing the common supply voltage of all analog switches depending on the control signal, particularly can be adjusted to the setpoint value of the same or the additional setpoint setting R_SET of the reference analog switch(es) S_REF. The change in the common supply voltage can occur, e.g., in that a voltage regulator generating or influencing the supply voltage is controlled by the control signal.

According to another aspect of the invention, the object is achieved by a method, in which the internal temperature-dependent on-resistance can be continuously compared by at least one additional similar reference analog switch, arranged in the vicinity of the at least one analog switch, with at least one external, particularly temperature-independent reference resistance and with a control signal dependent on the comparison result; e.g., the common supply voltage of the at least one analog switch and of the at least one reference analog switch is adjusted by controlling a voltage regulator with the control signal, so that the internal temperature-dependent on-resistance of the at least one reference analog switch corresponds to a predefined setpoint value, particularly the at least one reference resistance.

The internal on-resistance, which in such an analog switch works between a pair of switch contacts, can be dependent not only on the temperature of the analog switch, but also on the value of the supply voltage with which such an analog switch is operated.

It is possible to use the invention at least in such analog switches that also have a supply voltage dependence of the internal on-resistance apart from the temperature dependence. Examples of this type of analog switch are the types MAX4662 and MAX4665 from the company Maxim, to which the invention is not limited, however.

According to an embodiment of the invention, it is thereby provided that the internal on-resistance of at least one reference analog switch is detected by measurement. This at least one reference analog switch is arranged in the vicinity of at least one additional analog switch to be compensated in regard to temperature, so that the reference analog switch has at least approximately the same temperature as the at least one analog switch to be compensated. In this regard, this type of vicinity is understood to be at least the local area around the at least one analog switch in which the same temperature conditions predominate. For example, it can be provided that the at least one reference analog switch together with the at least one analog switch to be compensated is arranged in a common chip housing. This is especially advantageous when such an integrated circuit formed as a chip comprises a plurality of analog switches.

Similarity can be understood thereby that the at least one reference analog switch can have the same type or the same process as the analog switch(es) to be compensated in regard to temperature, because then at least similar, the same temperature and/or voltage dependence of the internal on-resistance is to be expected.

Because the at least one reference analog switch has the same but at least a similar temperature, or experiences the same or at least similar temperature changes as the at least one analog switch to be compensated, it can be determined by measurement how its internal on-resistance changes precisely or preferably at least proportionally as in the case of the at least one other analog switch with a change in temperature. This measurement result can be used to keep the internal on-resistance of all analog switches constant or to regulate it to a desired value.

This occurs according to the invention in such a way that the determined resistance value of the internal on-resistance of the at least one reference analog switch is compared with the value of at least one external, temperature-stable reference resistance. This comparison can also be made indirectly by means of other electric variables, which are directly dependent on the specific resistance value.

A comparison result can be obtained by the comparison preferably in the form of an additional electric variable, which is used as a control signal, e.g., as a voltage signal for controlling a voltage regulator, which regulates the operating voltage of all analog switches, therefore, also of the at least one reference analog switch.

If the comparison therefore shows that the internal on-resistance of the at least one reference analog switch deviates from a setpoint value, e.g., the value of the at least one reference resistance, or that the variables dependent thereon deviate from one another, then in turn the comparison result, which forms the control variable for the voltage regulator, deviates also from a predefined setpoint value. The voltage is then readjusted by the voltage regulator in such a way that in the end effect the internal on-resistance is constant in comparison with its setpoint value, particularly the resistance value of the at least one reference resistance, or, for this reason, is regulated within narrow limits. This can be achieved when the comparison value or the control signal corresponds to its predefined setpoint value; accordingly the control deviation is minimized and the reference value remains constant or within narrow limits around its setpoint value.

The supply voltage regulation realized in such a way thereby acts on all analog switches overall, including reference analog switches, so that by keeping the internal resistance of the at least one reference analog switch constant, the internal resistances of all other analog switches of the examined circuit arrangement are also kept constant automatically at least within limits.

According to the invention, it can be provided thereby that the comparison and the voltage regulation occur in such a way that the supply voltage is adjusted so that the internal on-resistance of the at least one reference analog switch corresponds to the at least one reference resistance. In this optimized case, accordingly, the at least one reference resistance forms a measure for the setpoint value for the internal on-resistance of the at least one reference analog switch. For example, the reference resistance can be formed as R_REF=setpoint value or also as R_REF=const*setpoint value.

Furthermore, in this case, the comparison result and thereby the setpoint value desired in the regulation for the control deviation can be zero.

Any deviation of the actual comparison value or of the control signal from the particular setpoint value thereby provides advantageously both the extent of the deviation, particularly by the contribution of the reference value, and also the direction of the deviation, particularly by the sign of the comparison value or of the control signal, and can be used directly to serve as the input variable of a voltage regulator. If the setpoint value for the control signal is ZERO, the control signal can be used directly for controlling the voltage regulator, because then the control signal represents directly the extent and direction of the deviation from the desired setpoint value. If the setpoint value, in contrast, is selected as differing from ZERO, it can be provided that the voltage regulator carries out internally a setpoint/actual comparison between the setpoint value and the control signal and minimizes the determined setpoint/actual deviation by changing the supply voltage and thereby then adjusts the internal on-resistance of the at least one reference analog switch to its setpoint value, particularly the resistance value of the at least one reference resistance.

In an embodiment, it can be provided that the internal on-resistance is given not only by a single reference analog switch, but by a group of several, particularly at least two reference analog switches. In such a case, the internal on-resistance to be compared can be given by the effective total on-resistance of the group of all reference analog switches, e.g., as a sum, particularly when the reference analog switches are connected in series, as a quotient of the quotient sum, when the reference analog switches are connected in parallel, or in the case of other types of connection, e.g., also as a mean. This also applies to the entire effective reference resistance, when it is not given solely by a single reference resistance, but by a group of several, particularly at least two reference resistances.

In an embodiment of the invention, it can be provided that at least one differential amplifier, also called an operational amplifier, can be used to carry out the aforementioned comparison of the internal resistance and its setpoint value or reference resistance.

This type of differential amplifier can comprise two voltage inputs according to the invention, to which two voltages to be compared can be applied/are applied and have a voltage output at which depending on the comparison of the two input voltages as a control signal a control voltage is present as an input variable for the voltage regulator. It is provided here that the comparison of the resistances occurs indirectly by the voltages dependent on the resistances (e.g., Wheatstone bridge).

In an embodiment, a voltage to be compared in a voltage divider chain with at least one additional resistor can be tapped via the (effective) internal on-resistance of the at least one reference analog switch and the other voltage in a voltage divider chain with at least one additional resistor via the at least one reference resistance.

It can be provided thereby that the ratio of the resistance values of the resistors on both sides of the tap site of the voltages, which are used for the comparison, in the two voltage divider chains is the same. This can be achieved, e.g., in an embodiment, when the specific additional resistors in the specific voltage divider chains are identical.

Likewise, the specific additional resistors to form the voltage divider chain can be different from one another. The reference resistance need not absolutely correspond to a desired internal resistance.

According to an embodiment of the invention, the positive and/or the negative supply voltage of the analog switches can be regulated with the voltage regulator depending on the control signal, particularly the control voltage, which forms the ACTUAL value of the voltage control. It is essential for the invention that the overall voltage difference between the negative and positive supply voltage is influenced by the voltage control.

In an embodiment of the invention, a circuit arrangement can comprise at least one pair of two electrical contacts, which are connected/can be connected by a parallel circuit of a plurality of, particularly at least two analog switches, whereby each analog switch of this parallel circuit is connected in series to a resistor with different resistance value.

The possibility therefore exists, by controlling one or also a plurality of analog switches of this parallel circuit between the two contacts of the aforementioned contact pair, to set a desired resistance value, which results from the total resistance of the parallel-connected individual resistors, in addition to the connected internal resistances of the connected analog switches, which, however, according to the invention are kept constant by the supply voltage regulation and thereby can be regarded as a constant offset in each analog switch.

A resistance value adjusted in this way can be used in a hardware test, e.g., for testing control devices, whereby now according to the invention there is no further susceptibility in regard to temperature changes.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein the figures illustrate a circuit arrangement for carrying out an embodiment of the invention.

FIG. 1 illustrates a parallel circuit of a plurality of analog switches.

FIG. 2 illustrates a particular implementation of the frame in the circuit arrangement of FIG. 1.

DETAILED DESCRIPTION

FIG. 1 shows a circuit arrangement of the invention, which can be used to carry out the method of the invention. This is an example; there are numerous options for the embodiment of the control loop.

Evident here in FIG. 1 is a parallel circuit of a plurality of analog switches S0 to S15. All analog switches together with the single reference analog switch S_REF in this embodiment have a common voltage supply, which is symbolized by the frame 1. The supply voltage is provided here by voltage regulator 2. For clarity, FIG. 2 illustrates a particular implementation of the frame 1 in the circuit arrangement of FIG. 1, in which the plurality of analog switches S0 to S15 and the single reference analog switch S REF are implemented as a complementary transistor pair and inverter, controlled by respective switching signals (not shown). As shown, the supply voltage provided here by voltage regulator 2 is provided to the supply voltage input of each of the plurality of analog switches S0 to S15 and to the supply voltage input of the single reference analog switch S REF.

In this application there is a resistor R in series for each of the analog switches S0 to S15. Each of these resistors R thereby has a different resistance value, in this example with resistance values R0, R0/2, R0/4, ..., R0/($2^{N-1}$) with N=16 and R0=1 megaohms.

By controlling the 16 analog switches in this example one or also a plurality can be switched on, so that as a result a desired total resistance value can be formed between the terminals RES_L1 and RES_H1 of this parallel circuit. As shown here, several such parallel circuits can be realized with a contact pair in each case between which the desired resistance value can be set. Such parallel circuits can be used for resistance simulation as part of a hardware test.

To realize a compensation of the temperature dependence of the internal on-resistances here, a comparison circuit 3 is provided in the shown circuit arrangement, the single reference analog switch S_REF here forming a part of said comparison circuit. Comparison circuit 3 comprises a differential amplifier 4 which has a separate voltage supply comprising U+ and U−. Two voltage divider chains ST1 and ST2 are integrated between the supply voltages U+ and U− in this realization example. The voltage divider chain ST1 comprises a series circuit of a first resistor R1 and a reference resistor R_REF. Each of these resistors can also be realized by a plurality of individual resistors. Voltage divider chain ST2 comprises a first resistor R2 and a resistor which is given by the internal on-resistance of the reference analog switch S_REF. As already described, only a single reference analog switch S_REF is provided here, but a plurality can also be used, which then form an effective total internal resistance. Both voltage divider chains ST1 and ST2 are parallel.

A reference voltage U_REF, which declines across the (effective) reference resistor R_REF, is tapped from voltage divider chain ST1. R_REF is thereby preferably a resistor with a negligible temperature dependence. This can also apply to the other resistors R1 and R2, although this is not necessary when they have at least the same temperature dependence.

According to the temperature-dependent internal on-resistance of the reference analog switch, a temperature-dependent voltage U_ACTUAL declines across it. This voltage U_ACTUAL and the reference voltage U_REF are present at the input contacts of differential amplifier 4 and are compared in it. Depending on the comparison, differential amplifier 4 forms a comparison voltage U_COMP which corresponds to this comparison, is present at the output of differential amplifier 4, and, e.g., indicates whether the voltage U_ACTUAL is the same, greater, or smaller than the reference voltage U_REF.

The comparison voltage U_COMP forms a control signal here, which is used to control voltage regulator 2, which depending on U_COMP adjusts the supply voltage of all analog switches. The regulation can occur, e.g., in such a way that the supply voltage of all analog switches follows a strictly monotonous function of the voltage U_COMP at least within the operating range. The characteristic of this voltage regulator need not be especially precise, because it is part of a closed control loop.

Because the internal on-resistance of all analog switches apart from the temperature dependence also has a dependence on the supply voltage, a temperature-induced change in the internal on-resistance can be compensated by a supply voltage-induced counter-change and thereby the internal resistance can be kept constant. This type of constant internal resistance is then present approximately in all analog switches with the same supply voltage, when the operating voltage of all analog switches is regulated as a control variable to the corresponding value.

The operating point of the differential amplifier and thereby the desired internal on-resistance can thus be influenced directly by a change in the setpoint value.

It can be provided in this example and also in general that the at least one reference analog switch together with the analog switches that are to be compensated are arranged in a chip housing.

It can also be provided in general that in a spatial area of the at least one analog switch for the purpose of the temperature compensation according to the invention not only a reference analog switch or a group of reference analog switches but a plurality of individual or a plurality of groups of analog switches are arranged at different places in the area. Thus, the comparison according to the invention can be carried out in each case for the same analog switch(es) simultaneously also at different places in the spatial area, e.g., with one of the previously described differential amplifiers. To regulate the supply voltage, one signal can be selected from the thus available plurality of control signals, e.g., which is formed with the lowest control deviation or a new one, e.g., as a mean of all control signals.

There are numerous options for the precise embodiment of the voltage regulator. It is critical that the resistance S_REF of the reference analog switch(es) is compared with a fixed setpoint value, and based thereupon the common operating voltage of all analog switches is regulated so that this setpoint value is achieved. Realizations are also conceivable in which the output of the differential amplifier itself, therefore without a downstream voltage regulator, provides the operating voltage for the analog switches.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit arrangement comprising:
   at least one analog switch operated with a supply voltage and comprising a switching signal contact and a pair of switch contacts, wherein the switching signal contact is configured to receive an electrical switching signal depending on which an electrical connection is switched between the switch contacts, and wherein the switch contacts have an internal on-resistance that is temperature dependent;
   at least one additional similar reference analog switch in the vicinity of the at least one analog switch and operated with the same common supply voltage, wherein the switch contacts thereof are connectable continuously via the internal temperature-dependent on-resistance thereof; and
   at least one comparison circuit configured to compare the internal on-resistance of the at least one reference analog switch with at least one external reference resistance or another setpoint setting of the reference analog switch (es), and to generate at least one control signal to keep the internal on-resistance of the at least one reference analog switch constant by changing the common supply voltage of all analog switches depending on the control signal.

2. The circuit arrangement according to claim 1, further comprising a voltage regulator controlled with the at least one control signal by the at least one comparison circuit to regulate the internal on-resistance of the at least one reference analog switch by changing the common supply voltage of all analog switches depending on the control signal.

3. The circuit arrangement according to claim 2, wherein the at least one comparison circuit comprises a differential amplifier with at least two voltage inputs, to which two voltages to be compared are applied, and with a voltage output, at which depending on the comparison the control signal is present to control the voltage regulator, wherein a voltage to be compared in a voltage divider chain with at least one additional resistor is tapped via the internal on-resistance of the at least one reference analog switch and the other voltage in a voltage divider chain with at least an additional resistor is tapped via the at least one reference resistance.

4. The circuit arrangement according to claim 3, wherein the ratio of the resistance values of the resistors on both sides of the tap site of the voltages in both voltage divider chains is the same.

5. The circuit arrangement according to claim 2, wherein the comparison circuit contains at least one analog or digital control circuit, which measures the on-resistance of the at least one reference analog switch and compares it with a setpoint value of the same, and based on this comparison generates the control signal for controlling the voltage regulator.

6. The circuit arrangement according to claim 1, wherein the internal on-resistance, used for comparison, is formed by the mean or the sum, in a series connection, or the quotient of the quotient sum, in a parallel circuit of the individual internal on-resistances of a plurality of reference analog switches.

7. The circuit arrangement according to claim 1, wherein the positive and/or the negative supply voltage of the analog switches are regulated by a voltage regulator depending on the control signal.

8. The circuit arrangement according to claim 1, wherein the internal on-resistance is adjusted to the at least one reference resistance or the otherwise formed setpoint setting of the reference analog switch(es).

9. The circuit arrangement according to claim 1, further comprising at least two electrical contacts connected by a parallel circuit of a plurality of the analog switches, wherein each analog switch of the parallel circuit is connected in series to a resistor with a different resistance value.

10. A method for compensating the temperature dependence of the on-resistance of at least one analog switch, operated with a supply voltage, the method comprising:
    comparing the internal temperature-dependent on-resistance for at least one additional similar reference analog switch, arranged in a vicinity of the at least one analog switch, with at least one external temperature-independent reference resistance or with an otherwise predefined setpoint value for the resistance of the reference analog switch; and
    adjusting with a control signal dependent on the comparison result, the common supply voltage of the at least one analog switch and of the at least one reference analog switch so that the internal temperature-dependent on-resistance of the at least one reference analog switch corresponds to the predefined setpoint value or the at least one reference resistance.

11. A method according to claim 10, wherein the supply voltage is adjusted so that the control deviation, representing the difference between the setpoint value and actual value, becomes at least approximately zero.

12. A circuit arrangement comprising:
    a testing component comprising at least one analog switch having an internal resistance that is temperature dependent; and
    a comparison circuit comprising a reference analog switch having an internal resistance that is temperature dependent and comprising a reference resistance, the comparison circuit being arranged in a vicinity of the testing component such that the reference analog switch obtains substantially a same temperature as the analog switch during operation thereof,
    wherein the analog switch and the reference analog switch is supplied with the same supply voltage,
    wherein the internal resistance of the reference analog switch is compared to an internal resistance of the reference resistance, and
    wherein the internal resistance of the analog switch and the internal resistance of the reference analog switch are adjusted via a change to the supply voltage such that the internal resistances of the analog switch and the reference analog switch become substantially the same as the internal resistance of the reference resistance.

13. The circuit according to claim 12, wherein the testing component comprises a plurality of analog switches.

14. The circuit according to claim 12, wherein the internal resistance of the analog switch and the internal resistance of the reference analog switch changes based on temperature and/or a value of the supply voltage.

15. The circuit according to claim 12, further comprising a resistor connected in series with the analog switch.

16. The circuit according to claim 15, wherein the resistor is connectable to a vehicle control device to test resistance values.

17. The circuit according to claim 12, wherein the comparison circuit further comprises a differential amplifier that is configured to provide a control signal.

18. The circuit according to claim 17, wherein the control signal indicates whether a value of a voltage based on the reference analog switch is the same, greater, or smaller than a value of a voltage based on the reference resistance.

19. The circuit according to claim 17, wherein the supply voltage is adjusted based on the control signal.

20. The circuit according to claim 12, wherein the reference resistance is a resistor.

* * * * *